United States Patent
Zhou et al.

(10) Patent No.: US 7,813,132 B2
(45) Date of Patent: Oct. 12, 2010

(54) HEAT DISSIPATION ASSEMBLY

(75) Inventors: Zhi-Yong Zhou, Shenzhen (CN); Ji-Yun Qin, Shenzhen (CN); Xiao-Jian He, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 74 days.

(21) Appl. No.: 12/248,897

(22) Filed: Oct. 10, 2008

(65) Prior Publication Data

US 2009/0268409 A1 Oct. 29, 2009

(30) Foreign Application Priority Data

Apr. 28, 2008 (CN) .................. 2008 1 0066871

(51) Int. Cl.
*H05K 7/20* (2006.01)
*F28F 7/00* (2006.01)

(52) U.S. Cl. ............... 361/705; 361/704; 361/709; 361/710; 165/185; 257/707

(58) Field of Classification Search ............ 361/704, 361/705, 709, 710; 257/707; 165/185
See application file for complete search history.

(56) References Cited

U.S. PATENT DOCUMENTS

| | | | | |
|---|---|---|---|---|
| 5,168,926 A * | 12/1992 | Watson et al. | ............ | 165/185 |
| 5,897,917 A * | 4/1999 | Hinshaw et al. | ............ | 422/258 |
| 6,029,740 A * | 2/2000 | Lee et al. | ............ | 165/76 |
| 6,049,458 A * | 4/2000 | Lee et al. | ............ | 361/705 |
| 6,059,116 A * | 5/2000 | Hinshaw et al. | ............ | 206/714 |
| 6,143,076 A * | 11/2000 | Rasmussen et al. | ............ | 118/411 |
| 6,644,395 B1 * | 11/2003 | Bergin | ............ | 165/185 |
| 6,881,265 B2 * | 4/2005 | Makley et al. | ............ | 118/211 |
| 6,935,420 B1 * | 8/2005 | Dong et al. | ............ | 165/185 |
| 6,945,312 B2 * | 9/2005 | Czubarow et al. | ............ | 165/80.3 |
| 7,051,790 B2 * | 5/2006 | Lin | ............ | 165/80.2 |
| 7,063,136 B2 * | 6/2006 | Yu et al. | ............ | 165/185 |
| 7,068,512 B2 * | 6/2006 | Lee et al. | ............ | 361/704 |
| 7,068,514 B2 * | 6/2006 | Chang et al. | ............ | 361/705 |
| 7,319,592 B2 * | 1/2008 | Wang et al. | ............ | 361/705 |
| 7,349,210 B2 * | 3/2008 | Sheng et al. | ............ | 361/695 |
| 7,365,983 B2 * | 4/2008 | Huang et al. | ............ | 361/704 |
| 7,441,593 B2 * | 10/2008 | Wu | ............ | 165/185 |
| 7,554,807 B2 * | 6/2009 | Wu et al. | ............ | 361/705 |
| 7,589,969 B2 * | 9/2009 | Wang et al. | ............ | 361/705 |
| 7,623,350 B2 * | 11/2009 | Tien et al. | ............ | 361/719 |
| 2002/0163076 A1 * | 11/2002 | Tzeng et al. | ............ | 257/720 |
| 2006/0042787 A1 * | 3/2006 | Yu et al. | ............ | 165/185 |

(Continued)

*Primary Examiner*—Anatoly Vortman
(74) *Attorney, Agent, or Firm*—Frank R. Niranjan

(57) ABSTRACT

A heat dissipation assembly has a containment apparatus preventing unwanted migration of a thermal interface material to surrounding areas on a top surface of a heat sink. The containment apparatus includes a cap correspondingly covering the thermal interface material and an annular frame extending downwardly from a bottom end of the cap and attached to a periphery of a top of the heat sink. The cap includes a ceiling and a plurality of inclined sidewalls extending downwardly and outwardly from edges of the ceiling, thereby forming a protective space within the cap combining with the top surface of the heat sink to enclose the thermal interface material. Two ears extend outwardly from the frame and accommodate opposite ends of an abutting body of a wire clip therein.

16 Claims, 3 Drawing Sheets

U.S. PATENT DOCUMENTS

2006/0232936 A1* 10/2006 Wu .............................. 361/704
2007/0012421 A1* 1/2007 Lin et al. .................... 165/80.2
2007/0217161 A1* 9/2007 Wu et al. .................... 361/710

* cited by examiner

HEAT DISSIPATION ASSEMBLY

BACKGROUND OF THE INVENTION

1. Field of the Invention

The disclosure relates generally to heat dissipation, and particularly to a heat dissipation assembly having a containment apparatus for containing a thermal interface material.

2. Description of Related Art

Electronic devices such as central processing units (CPUs) generate considerable heat during normal operation, which, if not properly dissipated, can deteriorate operational stability and damage associated electronic devices. A heat sink is often directly attached to a top surface of an electronic device to remove heat therefrom. Gaps formed between the heat sink and the electronic device reduce heat transfer efficiency To ensure consistent and effective contact between the electronic device and the heat sink, a thermal interface material such as thermal grease or thermal tape is often applied to a surface of the heat sink. A strip of thermal tape applied to the bottom surface of the heat sink in advance does not contaminate surrounding articles or attract contamination by dust or foreign particles during transportation or handling of the heat sink since it is solid at ambient temperature, unlike thermal grease, which cannot be applied to the heat sink in advance since its semi-fluid state at ambient temperature promotes easy removal and contamination by dust or foreign particles before the heat sink is assembled to the CPU. Conventionally, the thermal grease is applied to the heat sink immediately prior to assembly to the CPU, extending assembly time. The thermal tape, while more convenient to use, has a higher viscosity when heated. Further, it cannot enhance heat conductivity of the heat sink as well as thermal grease.

What is needed, therefore, is a heat dissipation assembly providing a containment apparatus which can prevent the thermal grease from unwanted migration to surrounding areas or contamination by dust or foreign particles.

SUMMARY OF THE INVENTION

A heat dissipation assembly has a containment apparatus preventing unwanted migration of a thermal interface material to surrounding areas on a top surface of a heat sink. The containment apparatus includes a cap correspondingly covering the thermal interface material and an annular frame extending downwardly from a bottom end of the cap and attached to a periphery of a top of the heat sink. The cap includes a ceiling and a plurality of inclined sidewalls extending downwardly and outwardly from edges of the ceiling, thereby forming a protective space within the cap combining with the top surface of the heat sink to enclose the thermal interface material. The containment apparatus further includes two ears extending outwardly from two opposite sides of the annular frame. Each ear defines a receiving space accommodating a part of a clip for attaching the heat sink to a heat-generating electronic device.

Other advantages and novel features of the disclosure will become more apparent from the following detailed description when taken in conjunction with the accompanying drawings.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
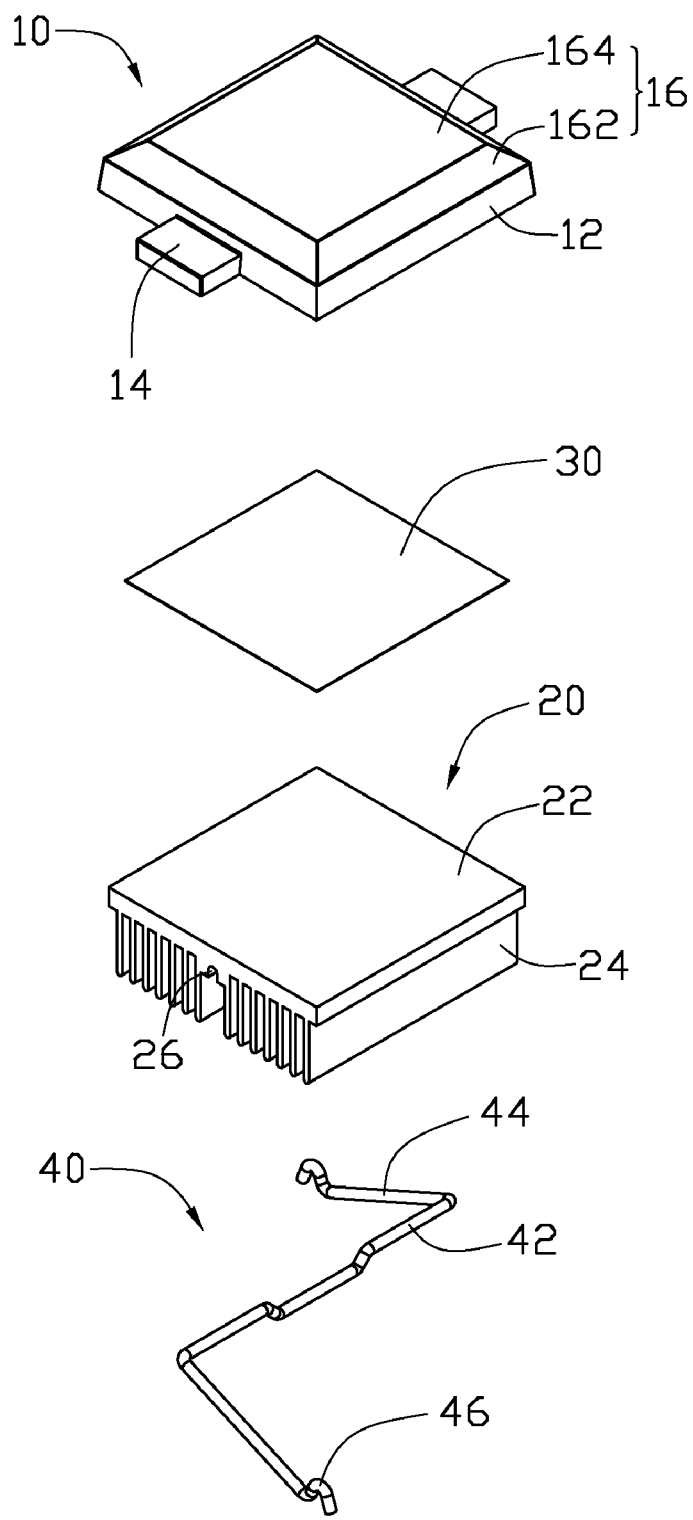
FIG. 1 is an exploded view of a containment apparatus according to a preferred embodiment of the disclosure, together with a heat sink, a clip and a thermal interface material.

Referring to FIG. 1, a containment apparatus 10 in accordance with a preferred embodiment of the disclosure, a heat sink 20, a thermal interface material 30 and a wire clip 40 securing the heat sink 20 onto a CPU (not shown) mounted on a printed circuit board (not shown) are shown. The thermal interface material 30, such as thermal grease, is applied on a top surface of the heat sink 20. The containment apparatus 10 is attached to a top of the heat sink 20 and encloses the thermal interface material 30.

Figure 2:
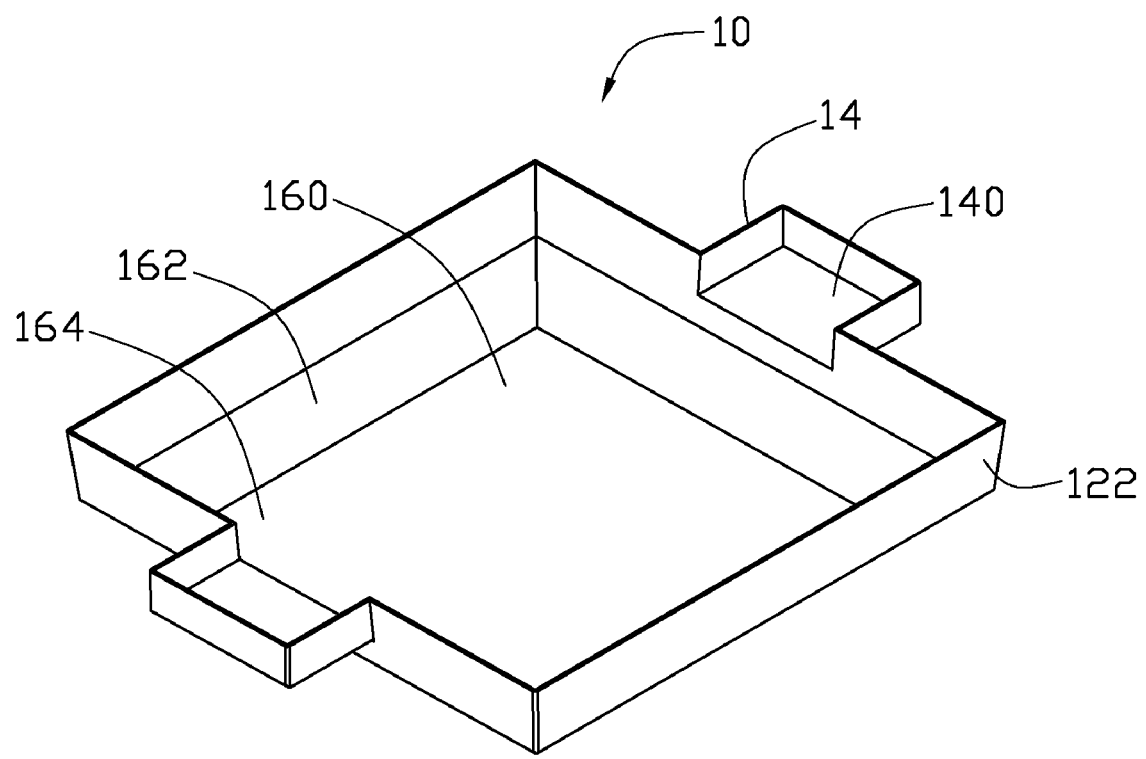
FIG. 2 is an enlarged view of the containment apparatus in FIG. 1, viewed from another aspect.

Also referring to FIG. 2, the containment apparatus 10 comprises a cap 16 and an annular frame 12 extending downwardly from a bottom end thereof. The cap 16 of the containment apparatus 10 comprises a rectangular ceiling 164 and four inclined sidewalls 162 respectively extending downwardly and outwardly from four edges of the ceiling 164, thereby defining a protective space 160. The four inclined sidewalls 162 surrounding the ceiling 164 are angled from the ceiling 164. The frame 12 is formed by four elongated flanges 122 respectively extending vertically and downwardly from bottom ends of four sidewalls 162 and are interconnected. The flanges 122 provide the frame 12 with a rectangular shape for corresponding attachment to a periphery of a top of the heat sink 20. Two ears 14 respectively project outwardly and horizontally from two central portions of two opposite flanges 122. Each of the ears 14 is cuboid and defines a receiving space 140 therein communicating with the protective space 160 and receiving a part of the clip 40.

The heat sink 20 is integrally made of metal with high heat conductivity such as copper, aluminum or alloys thereof. The heat sink 20 comprises a rectangular base 22 and a plurality of fins 24 extending downwardly from a bottom surface thereof. The thermal interface material 30 is applied to a top surface of the base 22. The fins 24 are spaced from each other and parallel to two opposite sides of the base 22. An elongated groove 26 is defined at a center of the bottom surface of the base 22 and located between two adjacent fins 24, receiving the clip 40 therein.

The clip 40 is a wire clip integrally made of a resilient metal wire. The clip 40 comprises an abutting body 42 and two locking arms 44 respectively extending perpendicularly but in two opposite directions from two opposite ends of the abutting body 42. A hook 46 is formed on a distal end of each locking arm 44 and configured to fasten to the printed circuit board, whereby the top surface of the base 22 of the heat sink 20 can have an intimate contact with the CPU.

Figure 3:
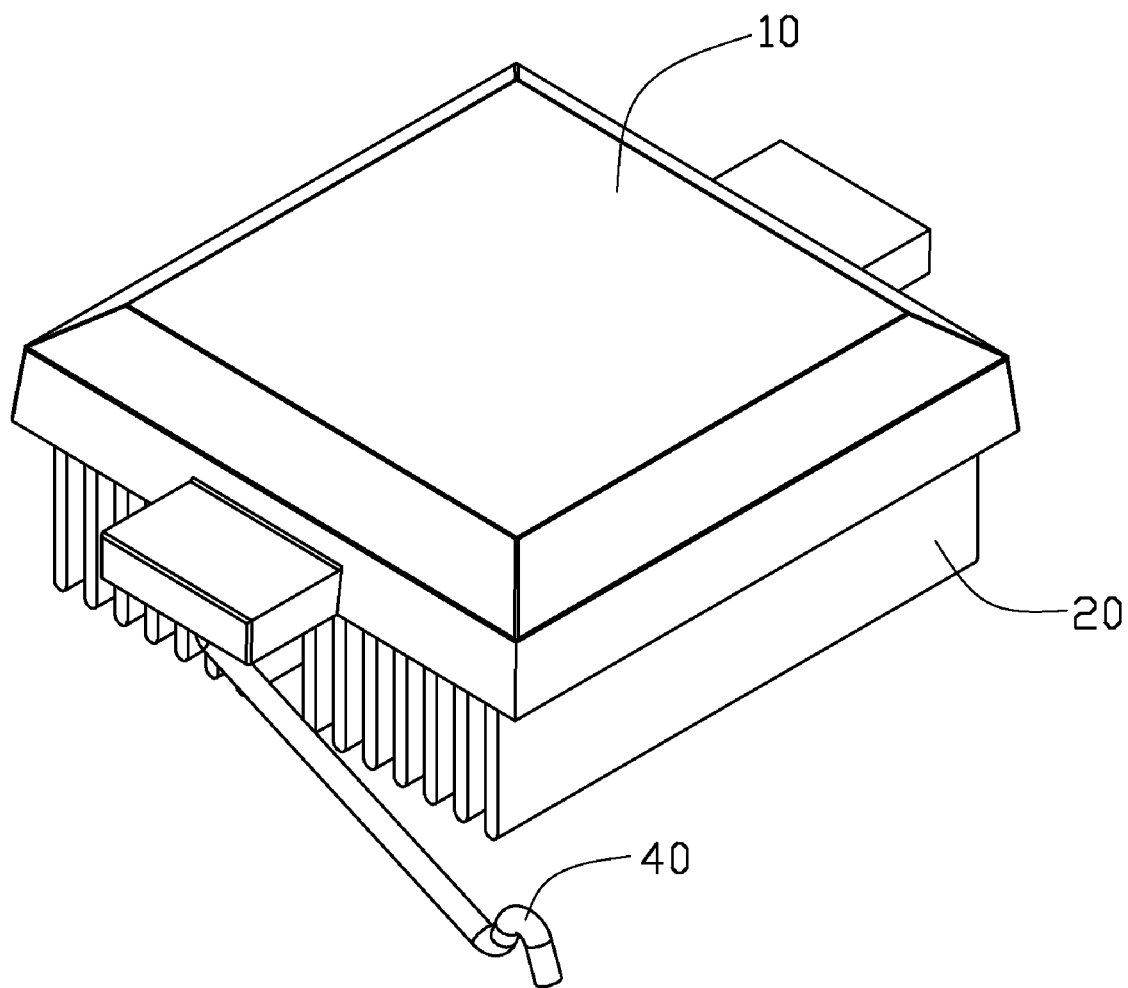
FIG. 3 is an assembled view of FIG. 1.

In assembly, referring to FIGS. 1-3 again, the abutting body 42 of the clip 40 is engagingly received in the groove 26 whilst the two locking arms 44 of the clip 40 are respectively located at two lateral sides of the heat sink 20. The containment apparatus 10 is disposed on the top of the heat sink 20 to cover the top surface of the heat sink 20 on which the thermal interface material is applied and two opposite end portions of the abutting body 42 of the clip 40 project laterally from two lateral sides of the heat sink 20. The elongated flanges 122 are snugly attached to four lateral sides of the base 22 to correspondingly position the cap 16 over the top of the heat sink 20, thus the containment apparatus 10 cooperates with the base 22 to securely enclose the thermal interface material 30 applied on the top surface of the base 22. Thus, the thermal interface material 30 is prevented from unwanted migration to surrounding areas and contamination by dust or foreign particles. Meanwhile, the receiving spaces 140 of the ears 14 of the containment apparatus 10 located at two lateral sides of the containment apparatus 10 correspondingly accommodate the two opposite end portions of the abutting body 42 of the clip 40 in order to avoid the clip 40 from interfering with the engagement between the containment apparatus 10 and the base 22. Furthermore, an adhesive strap can be applied on the frame 12 of the containment apparatus 10 to adhere the frame 12 to the periphery of the heat sink 20, whereby the containment apparatus 10 can be more reliably attached to the heat sink 20. Moreover, the ear 14 may serve as a handle to detach the containment apparatus 10 from the heat sink 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly, comprising:
   a heat sink comprising a base and a plurality of fins extending downwardly from a bottom surface thereof;
   a thermal interface material applied on a top surface of the base of the heat sink; and
   a containment apparatus attached to a top of the heat sink, comprising a cap and a frame extending downwardly from a bottom end of the cap;
   wherein the frame is attached to a periphery of the base to correspondingly position the cap over the top of the heat sink, and
   the cap comprises a rectangular ceiling and four inclined sidewalls respectively extending downwardly and outwardly from four edges of the ceiling.

2. The heat dissipation assembly as claimed in claim 1, wherein the four inclined sidewalls surrounding the ceiling are angled from the ceiling.

3. The heat dissipation assembly as claimed in claim 1, wherein the frame is rectangular and comprises four elongated flanges respectively extending vertically and downwardly from bottom ends of the inclined sidewalls.

4. The heat dissipation assembly as claimed in claim 3, wherein the base is rectangular, and four flanges of the frame are correspondingly attached to four lateral sides of the base.

5. The heat dissipation assembly as claimed in claim 1, wherein the fins are spaced from each other and parallel to two opposite sides of the base.

6. The heat dissipation assembly as claimed in claim 1, further comprising a clip spanning the base of the heat sink and two ears respectively projecting outwardly from two opposite flanges of the containment apparatus, the cap defining a protective space therein, and each of the two ears defining a receiving space therein communicating with the protective space for accommodating a part of the clip.

7. The heat dissipation assembly as claimed in claim 6, wherein an elongated groove is defined at a center of the bottom surface of the base and located between two adjacent fins.

8. The heat dissipation assembly as claimed in claim 7, wherein the clip comprises an abutting body received in the groove and two locking arms respectively extending perpendicularly but in two opposite directions from two opposite ends of the abutting body.

9. A heat dissipation assembly, comprising:
   a heat sink comprising a base and a plurality of fins extending downwardly from a bottom surface of the base;
   a thermal interface material applied on a top surface of the base of the heat sink; and
   a containment apparatus comprising a cap having a rectangular ceiling and four inclined sidewalls respectively extending downwardly and outwardly from four edges of the ceiling and a frame extending downwardly from a bottom end of the cap attaching to a periphery of the top of the heat sink;
   wherein the frame engages with a periphery of the base to allow the cap to cover the top surface of the base and enclose the thermal interface material therein.

10. The heat dissipation assembly as claimed in claim 9, wherein the frame is correspondingly attached to lateral sides of the base.

11. The heat dissipation assembly as claimed in claim 9, wherein the frame is rectangular and comprises four elongated flanges respectively extending vertically and downwardly from bottom ends of the plane sides of the inclined sidewalls.

12. The heat dissipation assembly as claimed in claim 9, wherein an elongated groove is defined at a center of the bottom surface of the base and located between two adjacent fins.

13. The heat dissipation assembly as claimed in claim 12, further comprising a clip securing the heat sink and comprising an abutting body received in the groove and two locking arms respectively extending perpendicularly but in two opposite directions from two opposite ends of the abutting body.

14. The heat dissipation assembly as claimed in claim 13, wherein two ears respectively project outwardly from two opposite flanges of the containment apparatus, the cap defining a protective space therein, and each of the two ears defining a receiving space therein communicating with the protective space and receiving a part of the clip.

15. A heat dissipation assembly, comprising:
   a heat sink comprising a base and a plurality of fins extending downwardly from a bottom surface thereof;
   a thermal interface material applied on a top surface of the base of the heat sink;
   a wire clip having an abutting body received between the fins and locking arms extending from two opposite ends of the abutting body;
   a containment apparatus attached to a top of the heat sink, comprising a cap and a frame extending downwardly from a bottom end of the cap;
   wherein the frame is attached to the base to correspondingly position the cap over the top of the heat sink, and wherein the containment apparatus further comprises two ears extending outwardly from two opposite sides of the frame, each ear defining a space receiving a corresponding end of the abutting body of the clip therein.

16. The heat dissipation assembly as claimed in claim 15, wherein the frame is attached to a periphery of the base of the heat sink.

* * * * *